United States Patent
Natsume

(10) Patent No.: US 7,535,046 B2
(45) Date of Patent: May 19, 2009

(54) DIELECTRIC MEMORY AND MANUFACTURING METHOD THEREOF

(75) Inventor: Shinya Natsume, Niigata (JP)

(73) Assignee: Panasonic Corporation, Osaka (JP)

(*) Notice: Subject to any disclaimer, the term of this patent is extended or adjusted under 35 U.S.C. 154(b) by 148 days.

(21) Appl. No.: 11/708,033

(22) Filed: Feb. 20, 2007

(65) Prior Publication Data

US 2007/0284642 A1    Dec. 13, 2007

(30) Foreign Application Priority Data

Jun. 7, 2006 (JP) ............... 2006-158308

(51) Int. Cl.
*H01L 29/76* (2006.01)
*H01L 21/8242* (2006.01)

(52) U.S. Cl. ............... 257/304; 257/306; 257/E27.094; 257/E21.649; 438/243; 438/244

(58) Field of Classification Search ........... 257/296, 257/304, E21.649, E27.094, 306; 438/243, 438/244, 586
See application file for complete search history.

(56) References Cited

U.S. PATENT DOCUMENTS

| | | | |
|---|---|---|---|
| 6,100,138 A * | 8/2000 | Tu ............... | 438/253 |
| 6,590,252 B2 | 7/2003 | Kutsunai et al. | |
| 6,770,527 B2 * | 8/2004 | Shukuri et al. ........... | 438/243 |
| 7,081,649 B2 * | 7/2006 | Watanabe et al. ......... | 257/288 |
| 2003/0222301 A1 * | 12/2003 | Igarashi ............. | 257/310 |
| 2004/0094791 A1 * | 5/2004 | Ito et al. ............. | 257/310 |

FOREIGN PATENT DOCUMENTS

| | | |
|---|---|---|
| JP | 2000-124426 | 4/2000 |
| JP | 2002-141478 | 5/2002 |
| JP | 3681632 | 5/2005 |

* cited by examiner

*Primary Examiner*—Tuan N. Quach
(74) *Attorney, Agent, or Firm*—McDermott Will & Emery LLP

(57) ABSTRACT

As an oxygen diffusion prevention layer, a multilayer film formed by a metal nitride and a noble metal element. As an interlayer insulation film on the oxygen diffusion prevention layer, a plasma CVD oxide film is used. Moreover, as an interlayer insulation film on a capacitor, an ozone TEOS film is used.

10 Claims, 10 Drawing Sheets

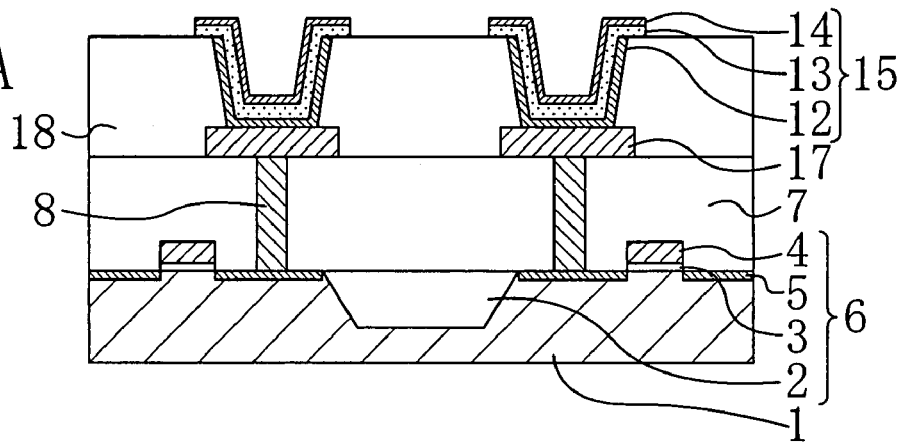
FIG. 9A
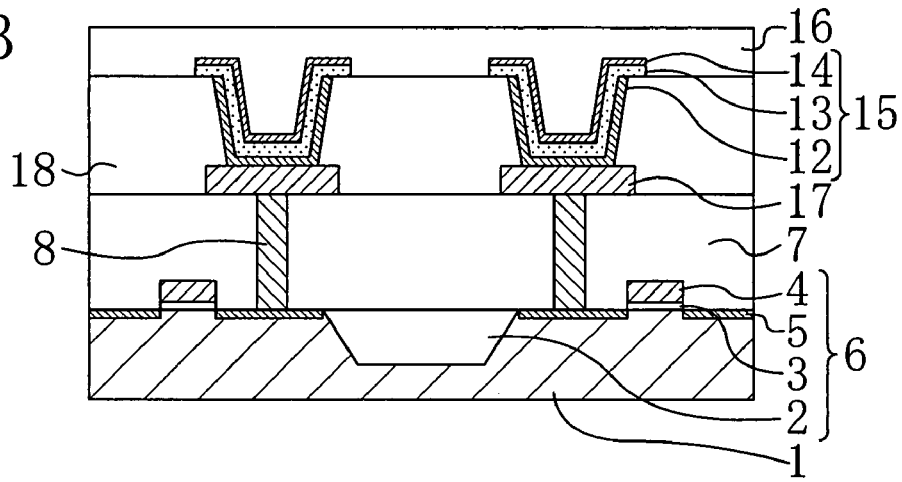
FIG. 9B
FIG. 9C
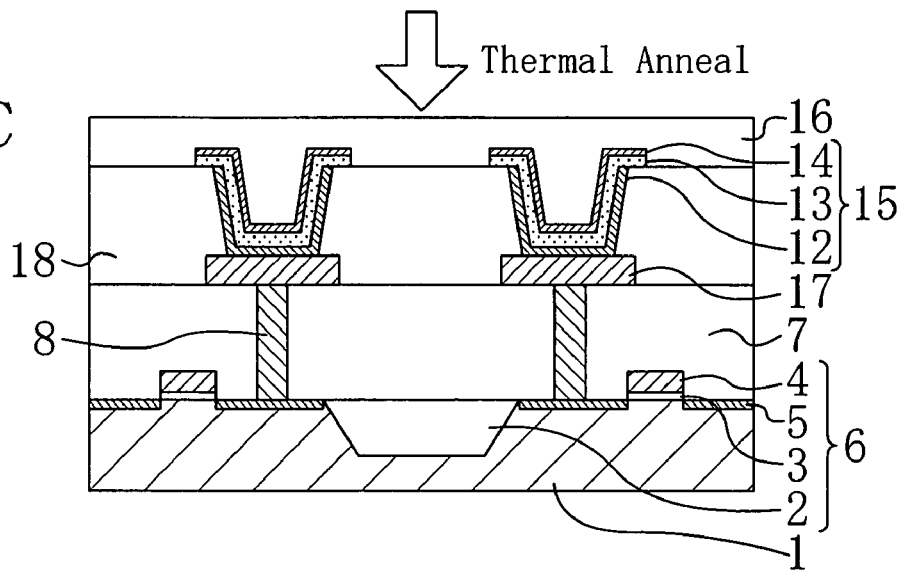

DIELECTRIC MEMORY AND MANUFACTURING METHOD THEREOF

BACKGROUND OF THE INVENTION

1. Field of the Invention

The present invention relates to a dielectric memory including a vertically stacked capacitor having a high dielectric constant material or a ferroelectric material and to a manufacturing method of such dielectric memory.

2. Description of the Prior Art

In a semiconductor memory having a high dielectric constant material or a ferroelectric material, for large-scale integration, a stacked memory cell is employed instead of a conventional planar memory cell. In such semiconductor memory, a thermal anneal is performed at a high temperature in an oxygen atmosphere in order to crystallize a dielectric film, which is a metal oxide. The thermal anneal oxidizes a contact plug provided under a capacitor. In order to prevent the oxidation of the contact plug in such semiconductor memory, an oxygen diffusion prevention layer is provided on the contact plug (see, for example, Japanese Patent No. 3681632 or Japanese Laid-Open Patent Publication No. 2000-124426).

FIG. 10 is a cross section illustrating a conventional dielectric memory including a vertically stacked capacitor. In this case, an example of a dielectric memory including a ferroelectric capacitor will be explained.

As shown in FIG. 10, the conventional dielectric memory includes a MOS transistor 506 on a semiconductor substrate 501, a ferroelectric capacitor 517 connected to one of impurity diffusion layers 505 of the MOS transistor 506, a contact plug 509, and an oxygen diffusion prevention layer 510 between the contact plug 509 and the ferroelectric capacitor 517.

The MOS transistor 506 includes a pair of impurity diffusion layers 505, a gate insulation film 503, and a gate electrode 504.

The ferroelectric capacitor 517 is provided in an opening 513 of a first ozone TEOS film 521 and includes a bottom electrode 514, a ferroelectric film 515, and a top electrode 516.

The conventional dielectric memory is manufactured through the following steps: forming a first ozone TEOS film 521 to cover an oxygen diffusion prevention layer 510; planarizing the first ozone TEOS film 521 by CMP; forming a bottom electrode 514 and a ferroelectric film 515; forming a conductive film, which is to be a top electrode 516 in an opening 513 to form a ferroelectric capacitor 517; forming a second ozone TEOS film 518 to cover the ferroelectric capacitor 517; planarizing the second ozone TEOS film 518 by CMP; and performing a thermal anneal at a high temperature in an oxygen atmosphere to crystallize a ferroelectric material forming the ferroelectric film.

In the conventional dielectric memory, an ozone TEOS film formed such that hydrogen is not produced in a formation process is provided on the oxygen diffusion prevention layer 510, and the bottom electrode 514 is embedded in the ozone TEOS film. In this structure, it is possible to prevent the reduction of the oxygen diffusion prevention layer 510 formed of, for example, a noble metal oxide. Moreover, the ferroelectric capacitor 517 is covered with the first ozone TEOS film 521 and the second ozone TEOS film 518. Therefore, the ferroelectric film 515 is not deteriorated by, for example, the reduction.

SUMMARY OF THE INVENTION

However, in the conventional dielectric capacitor, as shown in FIG. 10, a film thickness of a multilayer film formed by the first ozone TEOS film 521 and the second ozone TEOS film 518 is thick due to the vertical capacitor formed therein. This leads to a problem that stress due to a thermal anneal easily causes a crack 522. Therefore, defects such as deterioration of capacitance properties and decrease in reliability may occur.

Instead of the ozone TEOS film, a plasma CVD oxide film which can be formed in higher density may be used. In this case, it is possible to reduce a stress variation in a thermal anneal, and thus to eliminate the crack 522. However, hydrogen and plasma are produced during the formation of the plasma CVD oxide film, so that the ferroelectric material is reduced. This leads to a novel problem, deterioration of capacitance properties.

In view of the above-mentioned problems, an object of the present invention is to provide a dielectric memory and the manufacturing method thereof in which both deterioration of an oxygen diffusion prevention layer and occurrences of crack in an interlayer insulation film which affect capacitance properties are suppressed in a vertically stacked capacitor.

A first dielectric memory of the present invention includes: an interlayer insulation film on a semiconductor substrate; a contact plug in the interlayer insulation film; an oxygen diffusion prevention layer on an upper surface of the contact plug; a first ozone TEOS film on the interlayer insulation film, the first ozone TEOS film covering the oxygen diffusion prevention layer; a plasma CVD oxide film on the first ozone TEOS film; a capacitor formed in an opening which penetrates through the first ozone TEOS film and the plasma CVD oxide film and reaches an upper surface of the oxygen diffusion prevention layer, the capacitor including a bottom electrode, a dielectric film, and a top electrode; and an insulation film on the plasma CVD oxide film, the insulation film covering the capacitor.

In this case, hydrogen is not produced during the formation of the ozone TEOS film. Therefore, according to the structure described above, the ozone TEOS film on the oxygen diffusion prevention layer prevents the reduction of the oxygen diffusion prevention layer by the hydrogen. Therefore, deterioration of diffusion prevention characteristics of the oxygen diffusion prevention layer is suppressed. Therefore, oxidation of the contact plug due to the deterioration of the oxygen diffusion prevention layer is also suppressed. Moreover, the plasma CVD oxide film is formed on the first ozone TEOS film, and the capacitor is provided in the first ozone TEOS film and the plasma CVD oxide film. Therefore, it is possible to reduce the film thickness of the ozone TEOS film. That is, it is possible to suppress the occurrences of crack which has conventionally occurred in an ozone TEOS film having a too thick film thickness.

It is preferable that the first ozone TEOS film has a film thickness of 50 nm to 600 nm to prevent hydrogen produced during the formation of the plasma CVD oxide film from reaching the oxygen diffusion prevention layer and to prevent the occurrences of crack.

Moreover, it is preferable that the insulation film on the capacitor is an ozone TEOS film. This can prevent deformation of the top electrode in a thermal anneal of the dielectric material.

A second dielectric memory of the present invention includes: an interlayer insulation film on a substrate; a contact plug in the interlayer insulation film; an oxygen diffusion prevention layer formed by a multilayer film including a metal nitride film and a single elementary film of a noble metal which is formed to contact an upper surface of the contact plug; a plasma CVD oxide film covering the oxygen diffusion prevention layer; a capacitor formed in an opening which penetrates through the plasma CVD oxide film and reaches an upper surface of the diffusion prevention film, the capacitor including a bottom electrode, dielectric film, and a top electrode; and an ozone TEOS film on the plasma CVD oxide film, the ozone TEOS film covering the capacitor.

In this structure, the single elementary film of a noble metal which is not reduced by hydrogen is formed in the oxygen diffusion prevention layer. As a result, the oxygen diffusion prevention layer is hardly deteriorated even in a case where the plasma CVD oxide film is formed directly on the oxygen diffusion prevention layer. Therefore, it is possible to prevent the oxidation of the contact plug with a simpler structure, so that the reliability of the dielectric memory is increased.

A manufacturing method of the first dielectric memory of the present invention includes the steps of: forming an interlayer insulation film on a substrate; forming a contact plug in the interlayer insulation film to contact the substrate; forming an oxygen diffusion prevention layer on the interlayer insulation film to contact the contact plug; forming a first insulation film on the oxygen diffusion prevention layer such that hydrogen is not produced in a formation process; forming a plasma CVD oxide film on the first insulation film; forming an opening to penetrate through the first insulation film and the plasma CVD oxide film and to reach an upper surface of the oxygen diffusion prevention layer; forming a capacitor including a bottom electrode, a dielectric film, and a top electrode along the opening; forming a second insulation film on the plasma CVD oxide film such that hydrogen is not produced in a formation process to cover the capacitor.

According to this method, the oxygen diffusion prevention layer is covered with the first insulation film formed such that hydrogen is not produced. Therefore, it is possible to prevent the oxygen diffusion prevention layer from being subjected to the hydrogen, and thus the oxygen diffusion prevention layer is not reduced by the hydrogen. Therefore, it is possible to suppress deterioration of characteristics of the oxygen diffusion prevention layer.

A manufacturing method of the second dielectric memory of the present invention includes the steps of: forming an interlayer insulation film on a substrate; forming a contact plug in the interlayer insulation film to contact the substrate; forming an oxygen diffusion prevention layer on the interlayer insulation film to contact the contact plug, the oxygen diffusion prevention layer being formed by a multilayer film formed by a metal nitride film and a single elementary film of a noble metal; forming a plasma CVD oxide film on the oxygen diffusion prevention layer; forming an opening to penetrate through the plasma CVD oxide film and to reach an upper surface of the oxygen diffusion prevention layer; forming a capacitor including a bottom electrode, a dielectric film, and a top electrode along the opening; and forming an insulation film on the plasma CVD oxide film such that hydrogen is not produced in a formation process to cover the capacitor.

The single elementary film of a noble metal is not reduced in the presence of hydrogen. Therefore, according to this method, the oxygen diffusion prevention layer is hardly deteriorated even in a case where the plasma CVD oxide film is formed directly on the oxygen diffusion prevention layer.

BRIEF DESCRIPTION OF THE DRAWINGS

FIGS. 9A through 9C are cross sections with which a manufacturing method of the dielectric memory according to Embodiment 2 is described.

DESCRIPTION OF THE PREFERRED EMBODIMENTS

A dielectric memory according to Embodiments of the present invention will be described below with reference to the drawings.

Embodiment 1

Figure 1:
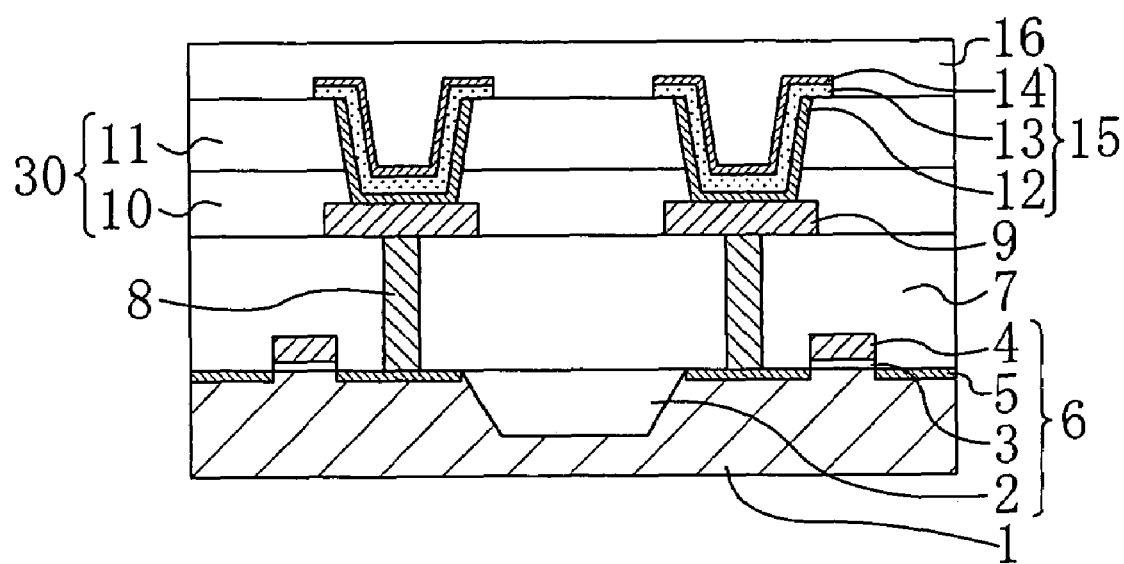
FIG. 1 is a cross section illustrating a structure of a dielectric memory according to Embodiment 1 of the present invention.

FIG. 1 is a cross section illustrating a structure of a dielectric memory according to Embodiment 1 of the present invention.

As shown in FIG. 1, a shallow trench isolation (STI) region 2 is provided in an upper part of a semiconductor substrate 1 which is formed of, for example, silicon (Si). Element formation regions are sectioned by the STI region 2. A transistor 6 is provided in each element formation region. The transistor 6 includes a gate insulation film 3 on the element formation region, a gate electrode 4 on the gate insulation film 3, and impurity diffusion layers 5 formed laterally on both sides of the gate electrode 4.

A first interlayer insulation film 7 formed of a silicon oxide is provided on the semiconductor substrate 1 to cover each transistor 6, the first interlayer insulation film 7 having a film thickness of about 0.4 μm to about 0.8 μm. An upper surface of the first interlayer insulation film 7 is flat. In this case, as the silicon oxide, a so-called BPSG (Boro-Phospho-Silicate Glass) which contains boron (B) and phosphor (P), a so-called HDP-NSG (High Density Plasma-Non Silicate Glass) which is formed by high density plasma and does not contain boron and phosphor, or an ozone TEOS (ozone NSG) which is formed by using ozone ($O_3$) and TEOS (tetra-ethyl-orthosilicate) in an oxidizing atmosphere may be used. Hereinafter, a silicon oxide film which is formed by growing TEOS as a starting material is referred to as "TEOS film", and a film which is formed by growing TEOS as a starting material especially in the presence of ozone is referred to as "ozone TEOS film".

Moreover, in the dielectric memory of Embodiment 1, a contact plug 8 is provided on one of the impurity diffusion layers 5 of each transistor 6. The contact plug 8 is electrically connected to the impurity diffusion film 5. The contact plug 8 penetrates through the first interlayer insulation film 7. As a material for the contact plug 8, tungsten (W) may be used. Alternatively, as a material for the contact plug 8, polycrystalline silicon doped with an impurity may be used.

Further, oxygen diffusion prevention layers 9 are formed on the planarized upper surface of the first interlayer insulation film 7. Each oxygen diffusion prevention layer 9 covers an upper surface of the corresponding contact plug 8 to electrically connect the contact plug 8. The oxygen diffusion prevention layer 9 is formed by a multilayer film including a lower film formed of a noble metal nitride and an upper film formed of a noble metal oxide. The film formed of the noble metal nitride is a film formed of, for example, titanium nitride (TiN), titanium aluminum nitride (TiAlN), or titanium aluminum oxynitride (TiAlON). The film formed of the noble metal oxide is an oxide film formed of, for example, platinum, iridium, or ruthenium. Moreover, the oxygen diffusion prevention layer 9 may be formed by a three-layer film including a metal nitride film, a noble metal film, and a noble metal oxide film.

Moreover, on the first interlayer insulation film 7, a first ozone TEOS film 10 and a plasma CVD oxide film 11 are formed in this order from the bottom. Openings which reach each oxygen diffusion prevention layer 9 are formed in the first ozone TEOS film 10 and plasma CVD oxide film 11. A capacitor 15 is provided in each opening. In the dielectric memory of Embodiment 1, a second interlayer insulation film 30 formed by the first ozone TEOS film 10 and the plasma CVD oxide film 11 provided on the first ozone TEOS film 10 surrounds a dielectric capacitor.

Since hydrogen is produced during the formation of a silicon oxide film by plasma CVD, forming the plasma CVD oxide film directly on the oxygen diffusion prevention layer 9 may cause a reduction of the oxygen diffusion prevention layer 9 and a deterioration in its barrier function against oxygen. However, in the dielectric memory of Embodiment 1, the first ozone TEOS film 10 formed such that hydrogen is not produced in a formation process is provided between the oxygen diffusion prevention layer 9 and the plasma CVD oxide film 11. In this structure, it is possible to prevent the hydrogen from diffusing into the oxygen diffusion prevention layer 9 in a manufacturing step. Therefore, it is possible to maintain the barrier function of the oxygen diffusion prevention layer 9 and to suppress oxidation of the contact plug 8. Consequently, it is possible to improve reliability of the dielectric memory.

It is preferable that the first ozone TEOS film 10 has a film thickness of 50 nm to 600 nm. This is because an ozone TEOS film having a film thickness of at least 50 nm is required to prevent hydrogen produced during the formation of the plasma CVD oxide film from reaching the oxygen diffusion prevention layer. However, the film thickness is required to be 600 nm or less, because a crack may occur in a thick film. It is more preferable that the first ozone TEOS film 10 has a film thickness of 100 nm to 600 nm. A film thickness of the multilayer film formed by the first ozone TEOS film 10 and the plasma CVD oxide film 11 is a parameter which determines the capacitance value of the capacitor to be explained later, and the film thickness is 600 nm to 1200 nm. Note that, "plasma CVD oxide film" refers to a silicon oxide film formed by plasma CVD.

TABLE 1

| Type of Film | Film Thickness | | | | |
|---|---|---|---|---|---|
| | 500 nm | 600 nm | 700 nm | 800 nm | 900 nm |
| Ozone TEOS Film | ○ | ○ | x | x | x |
| Plasma CVD Oxide Film | ○ | ○ | ○ | ○ | ○ |

An explanation as to a film thickness of the ozone TEOS film 10 will be given below.

Table 1 shows a relation between a film thickness and occurrences of crack in the ozone TEOS film and plasma CVD oxide film.

As shown in Table 1, a thermal anneal causes a crack overall surface of a wafer on which an ozone TEOS film having a film thickness of more than 600 nm is provided. Therefore, it is preferable that the ozone TEOS film has a film thickness of 600 nm or less. Moreover, in order to prevent the hydrogen which is produced in forming the plasma CVD oxide film 11 from diffusing into the oxygen diffusion prevention layer 9, the first ozone TEOS film 10 is required to have a film thickness of at least 50 nm, and a film thickness of 100 nm or more is required to certainly suppresses diffusion of hydrogen.

Figure 5:
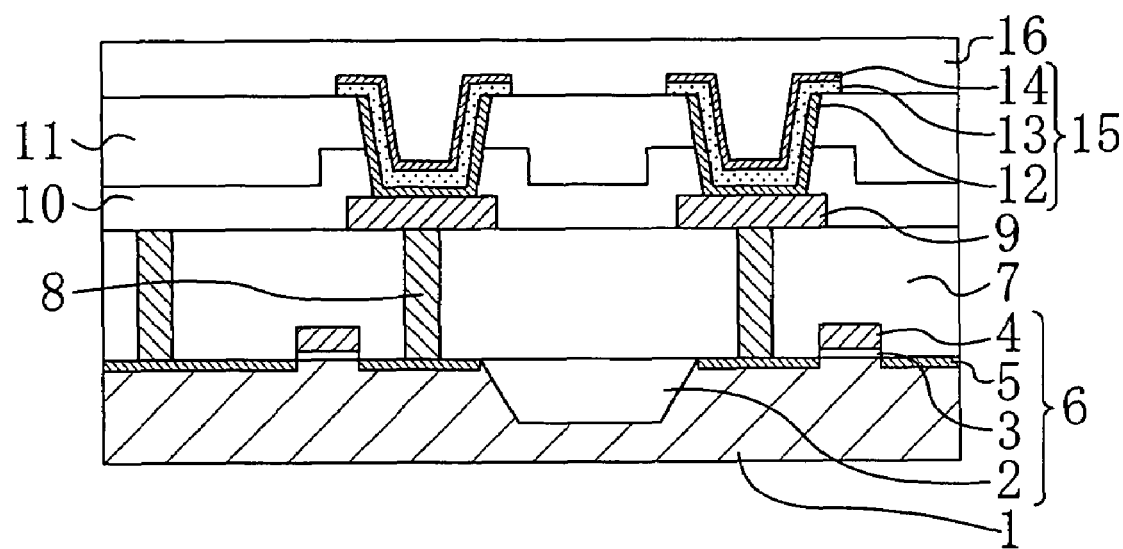
FIG. 5 is a cross section illustrating an exemplary dielectric memory according to Embodiment 1.
Figure 6:
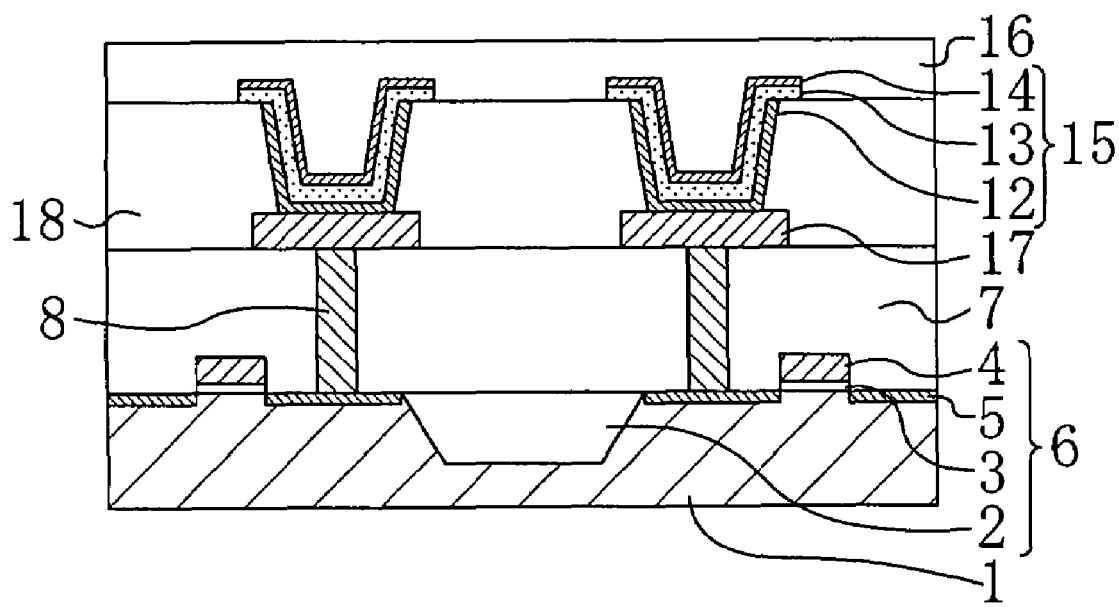
FIG. 6 is a cross section illustrating a structure of a dielectric memory device according to Embodiment 2 of the present invention.

FIG. 5 is a cross section illustrating another example of the dielectric memory of Embodiment 1. In the example shown in FIG. 5, a contact plug 8 is also provided outside a capacitor region. A plasma CVD oxide film directly formed on the contact plug 8 outside the capacitor region would lead to a dielectric breakdown of the gate insulation film 3, because plasma charges flow via the contact plug 8 to the gate insulation film 3. However, in the dielectric memory of Embodiment 1, it is the ozone TEOS film that contacts the contact plug 8. Therefore, the plasma charges do not flow to the gate insulation film 3, and the dielectric breakdown of the gate insulation film 3 is prevented.

In each opening in the second interlayer insulation film 30, a capacitor 15 is provided as described above. The capacitor 15 is formed along side surfaces and a bottom surface of the opening. The capacitor 15 includes the bottom electrode 12 which is formed of, for example, a noble metal oxide, a nitride, or an oxynitride, a capacitative insulation film 13 on the bottom electrode 12, and the top electrode 14 on the capacitative insulation film 13.

A specific example of a material for the bottom electrode 12 and the top electrode 14 is an oxide, a nitride or an oxynitride of platinum, iridium, ruthenium, gold, silver, palladium, rhodium, or osmium.

Moreover, a nonvolatile ferroelectric memory can be manufactured by the capacitative insulation film 13 formed of a material as follows: a dielectric material of ferroelectric barium strontium titanic acid ($Ba_xSr_{1-x}TiO_3$) (where $0 \leq x \leq 1$) (hereinafter, referred to as BST); a perovskite dielectric material which includes lead such as zirconium lead titanate ($Pb(Zr_xTi_{1-x})O_3$) (where $0 \leq x \leq 1$) (hereinafter, referred to as PZT) or zirconium lead titanate lanthanum ($Pb_yLa_{1-y}(Zr_xTi_{1-x})O_3$) (where $0 \leq x \leq 1$ and $0 \leq y \leq 1$); or a perovskite dielectric material which includes bismuth such as tantalic acid strontium bismuth ($Sr_{1-y}Bi_{2+x}Ta_2O_9$) (where $0 \leq x \leq 1$ and $0 \leq y \leq 1$) (hereinafter, referred to as SBT) or titanic acid bismuth lanthanum ($Bi_{4-x}La_xTi_3O_{12}$) (where $0 \leq x \leq 1$).

Moreover, as the capacitative insulation film 13, a compound having a perovskite structure indicated by a general formula of $ABO_3$ (where A and B are different elements) may be used. In this case, the element A is at least one element selected from the group consisting of, for example, lead (Pb), barium (Ba), strontium (Sr), calcium (Ca), lanthanum (La), lithium (Li), sodium (Na), potassium (K), magnesium (Mg), and bismuth (Bi), and the element B is at least one element selected from the group consisting of, for example, titanium (Ti), zirconium (Zr), niobium (Nb), tantalum (Ta), tungsten (W), iron (Fe), nickel (Ni), scandium (Sc), cobalt (Co), hafnium (Hf), magnesium (Mg) and molybdenum (Mo).

Moreover, the capacitative insulation film 13 is not limited to a monolayer ferroelectric film. The capacitative insulation film 13 may be formed by ferroelectric films having different compositions and further the different compositions may have compositionally gradient structures.

Moreover, a material for the capacitative insulation film 13 of the present invention is of course not limited to the ferroelectric material. A paraelectric material such as tantalum pentoxide ($Ta_2O_5$), aluminum oxide ($Al_2O_3$), or titanic acid barium strontium ($BaSr)TiO_3$ may be used. In this case, the dielectric memory of Embodiment 1 can operate as DRAM (Dynamic Random Access Memory).

Moreover, a second ozone TEOS film 16 is provided on the plasma CVD oxide film 11 of Embodiment 1 to cover the capacitor 15, and an upper surface of the second ozone TEOS film 16 is flat. In such structure, the ozone TEOS film formed such that hydrogen is not produced in a formation process is provided on the capacitor 15. Therefore, it is possible to prevent the reduction and deterioration of the dielectric material by the hydrogen. Moreover, providing the plasma CVD oxide film 11 between the first ozone TEOS film 10 and the second ozone TEOS film 16 makes it possible to prevent the occurrences of crack in the ozone TEOS films.

A manufacturing method of the above-described dielectric memory according to Embodiment 1 will be described below with reference to the drawings.

FIGS. 2A through 2F, FIGS. 3A through 3D, and FIGS. 4A through 4C are cross sections with which the manufacturing method of the dielectric memory according to Embodiment 1 of the present invention is described.

Figure 2A:
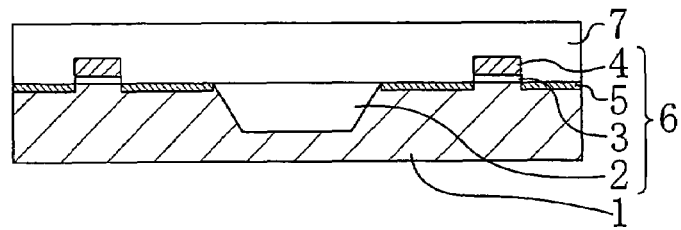
FIGS. 2A through 2F are cross sections with which a manufacturing method of the dielectric memory according to Embodiment 1 is described.

First, referring to FIG. 2A, an STI region 2 is selectively formed in an upper part of a semiconductor substrate 1. Element formation regions on the semiconductor substrate 1 are sectioned by the STI region 2. Then, in each element formation region, a gate insulation film 3 and a gate electrode 4 are sequentially formed. The gate insulation film 3 is formed of, for example, silicon oxide or silicon oxynitride. The gate electrode 4 contains polycrystalline silicon, metal, or metal silicide. Subsequently, an impurity is ionically implanted by using the gate electrode 4 as a mask to form impurity diffusion layers 5 in the element formation region, so that a transistor 6 is formed in each element formation region. Next, an insulation film such as BPSG, HDP-NSG, or $O_3$-NSG is formed by CVD. Then, an upper surface of the insulation film is planarized by Chemical Mechanical Polish (CMP) to form a first interlayer insulation film 7 having a film thickness of about 0.4 μm to about 0.8 μm.

Figure 2B:
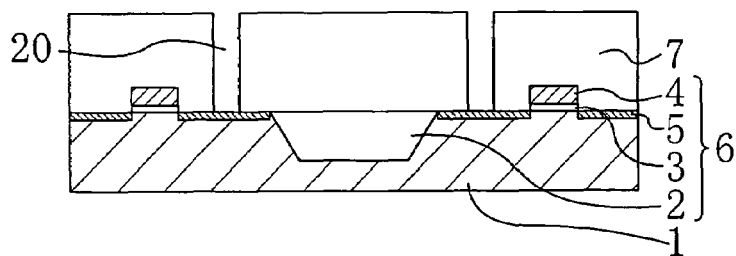

Next, referring to FIG. 2B, a contact hole 20 is formed to penetrate through the first interlayer insulation film 7 by lithography and dry etching methods, so that one of impurity diffusion layers 5 of the transistor 6 is exposed in the contact hole 20.

Figure 2C:
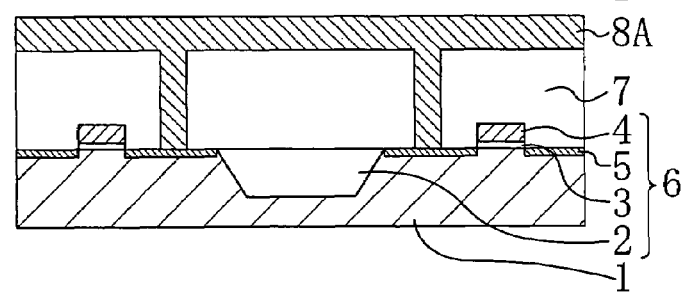

Subsequently, referring to FIG. 2C, a contact plug formation film 8A is formed on the first interlayer insulation film 7 by sputtering, CVD, or plating to fill the contact hole 20. In this case, the contact plug formation film 8A contains a metal, such as tungsten or copper, or polycrystalline silicon as a main material. Besides such main material, the contact plug formation film 8A may contain a nitride metal such as titanium nitride, or a silicide metal such as titanium silicide. Moreover, before the formation of the contact plug formation film 8A, an adhesion layer may be formed, the adhesion layer being formed by a multilayer film including a titanium film and titanium nitride film formed in this order on the substrate, or a tantalum film and tantalum nitride film formed in this order on the substrate.

Figure 2D:
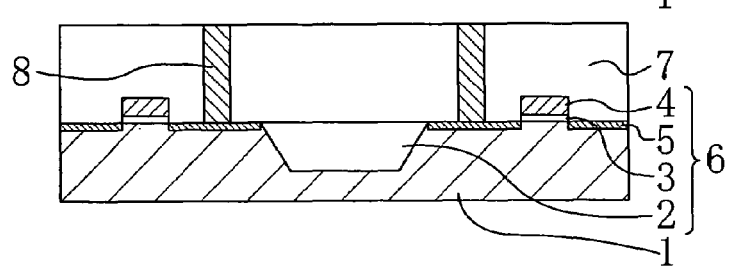

Next, referring to FIG. 2D, an etch back process or CMP is performed on the contact plug formation film 8A as far as the first interlayer insulation film 7 is exposed. In this way, the contact plug formation film 8A is formed into contact plugs 8 each of which is to be electrically connected to one of the impurity diffusion layers 5 of each transistor 6.

Figure 2E:
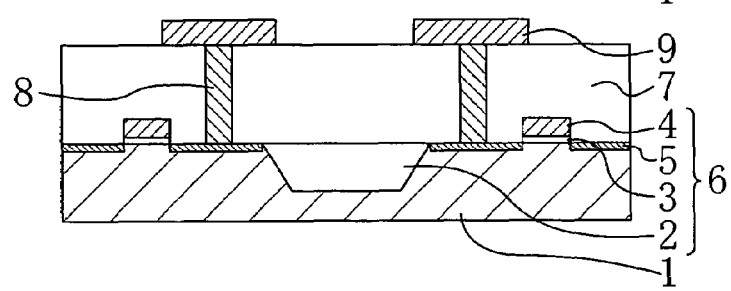

Next, as shown in FIG. 2E, an oxygen diffusion prevention layer formation film is formed on the whole surface of the first interlayer insulation film 7 by, for example, sputtering, CVD, or Metal Organic Chemical Vapor Deposition (MOCVD). The oxygen diffusion prevention layer formation film has a film thickness of 50 nm to 300 nm and prevents the oxidation of the contact plugs 8. As the oxygen diffusion prevention layer formation film, a film having a high barrier function against oxygen is used. As the oxygen diffusion prevention layer formation film, for example, a multilayer film is used which includes: a metal nitride film formed of, for example, titanium nitride, titanium aluminum nitride, or titanium aluminum oxynitride; and a noble metal oxide film formed of, for example, iridium oxide or ruthenium oxide. Next, lithography and dry etching methods are performed on the oxygen diffusion prevention layer formation film to leave the oxygen diffusion prevention layer formation film on the contact plugs 8 and around the contact plugs 8. In this way, the oxygen diffusion prevention layer formation film is formed into oxygen diffusion prevention layers 9. Note that, removing the contact plug formation film 8A from the first interlayer insulation film 7 may form a concavity (recess) on the top end surface of each contact plug 8, and each oxygen diffusion prevention layer 9 may be provided in this concavity. Such structure is not shown.

Figure 2F:
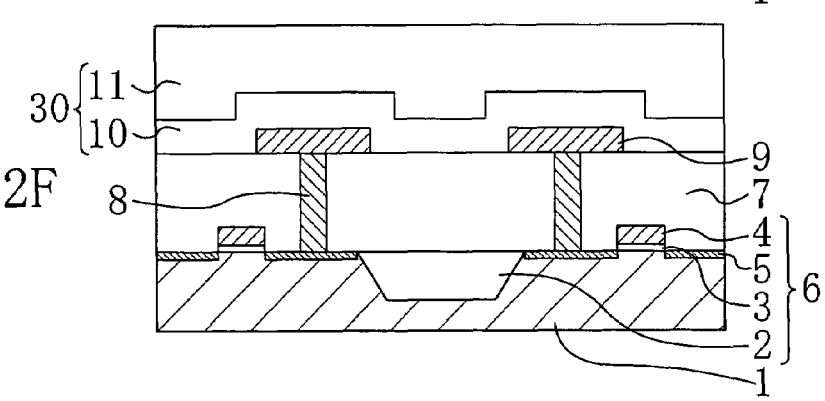

Next, referring to FIG. 2F, a first ozone TEOS film 10 having a film thickness of about 50 nm to about 600 nm is formed on the first interlayer insulation film 7, so that each oxygen diffusion prevention layer 9 is covered by the ozone TEOS film. The first ozone TEOS film 10 is formed by CVD using ozone and TEOS. In this step, a film formation temperature is 300° C. to 500° C., the flow rate of TEOS is 300 to 500 sccm (mL/min), and the flow rate of ozone is 4000 to 6000 sccm (mL/min). In this step, no hydrogen is produced during the formation of a silicon oxide film. As described above, it is preferable that the first ozone TEOS film 10 has a film thickness of 50 nm to 600 nm, and it is more preferable that the film thickness is 100 nm to 600 nm. Note that, in the step, instead of the first ozone TEOS film 10, an insulation film which can be formed without producing hydrogen may be provided.

Subsequently, a plasma CVD oxide film 11 is formed on the first ozone TEOS film 10, and CMP is performed for planarization. In this case, the greater a total film thickness of the first ozone TEOS film 10 and the plasma CVD oxide film 11, the greater is an effective area of a capacitor 15. Therefore, the total film thickness of the first ozone TEOS film 10 and the plasma CVD oxide film 11 is a parameter which determines the capacitance value of the capacitor. In this case, it is preferable that the total film thickness of the first ozone TEOS film 10 and the plasma CVD oxide film 11 is about 600 nm to about 1200 nm. In the formation of the plasma CVD oxide film 11, hydrogen is produced due to the decomposition of TEOS. However, the oxygen diffusion prevention layers 9 are hardly reduced by hydrogen, because the first ozone TEOS film 10 is formed under the plasma CVD oxide film 11. In FIG. 2F, the first ozone TEOS film 10 and the plasma CVD oxide film 11 are collectively indicated as a second interlayer insulation film 30.

In Embodiment 1, after the formation of the first ozone TEOS film 10, a surface of the first ozone TEOS film 10 may be planarized by CMP. In this way, it is possible to omit the step of planarizing the plasma CVD oxide film 11 which is to be formed later (see FIG. 1).

Figure 3A:
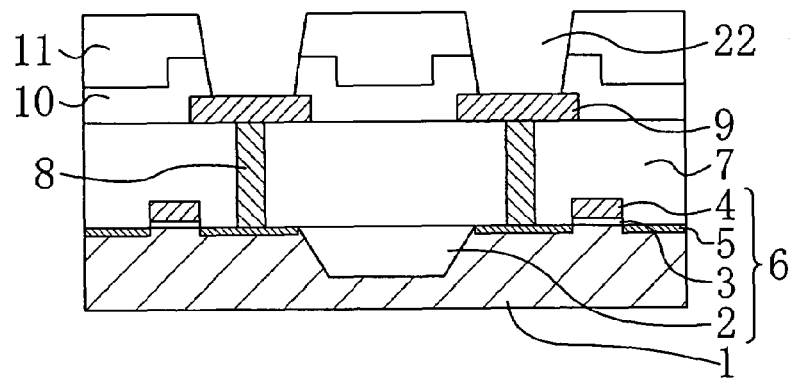
FIGS. 3A through 3D are cross sections with which a manufacturing method of the dielectric memory according to Embodiment 1 is described.

Next, referring to FIG. 3A, openings 22 are formed by lithography and etching methods in the second interlayer insulation film 30 which is formed by the first ozone TEOS film 10 and the plasma CVD oxide film 11. In each of the openings 22, an upper surface of the oxygen diffusion prevention layer 9 is exposed. The opening 22 has a diameter of, for example, about 0.2 μm to about 1.0 μm. In this case, etching performed to form the openings 22 may be a dry etching or a wet etching.

Figure 3B:
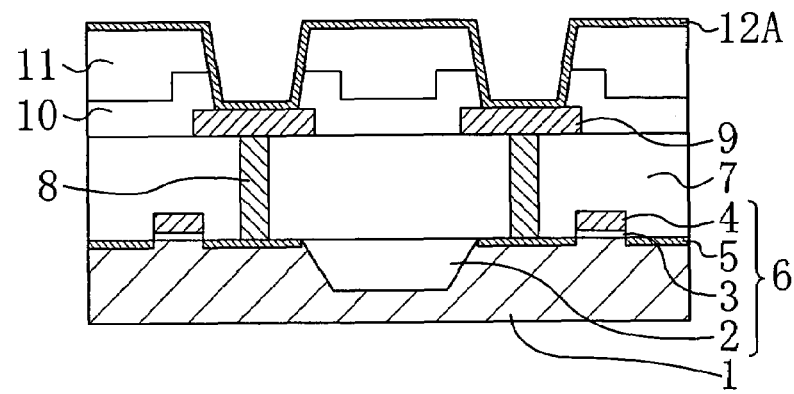

Next, referring to FIG. 3B, a bottom electrode formation film 12A is formed on side and bottom surfaces of each opening 22 and the whole surface of the plasma CVD oxide film 11 by sputtering, CVD, or MOCVD at a film formation temperature of 200° C. to 500° C. The bottom electrode formation film 12A is formed of a noble metal such as platinum or iridium or an oxide, a nitride, or an oxynitride thereof, and the bottom electrode formation film 12A has a film thickness of about 20 nm to 60 nm.

Figure 3C:
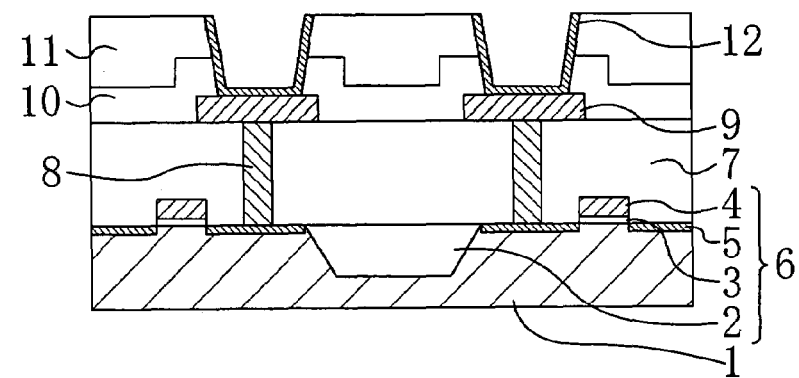

Next, referring to FIG. 3C, the bottom electrode formation film 12A formed on the plasma CVD oxide film 11 is polished by CMP as far as the plasma CVD oxide film 11 is exposed, so that a bottom electrode 12 is formed on the side and bottom surfaces of each opening 22.

Instead of CMP, an insulation film and a resist film (sacrifice film, not shown) may be formed to fill a concavity of the bottom electrode formation film 12A formed in each opening 22, and then etch back may be performed overall on the formed insulation film and the resist film by dry etching in order to remove a part of the bottom electrode formation film 12A which will not be formed into the bottom electrode 12. After that, the sacrifice film on the bottom electrode 12 is removed by wet etching or by using a developing solution, so that the bottom electrode 12 is formed.

Figure 3D:
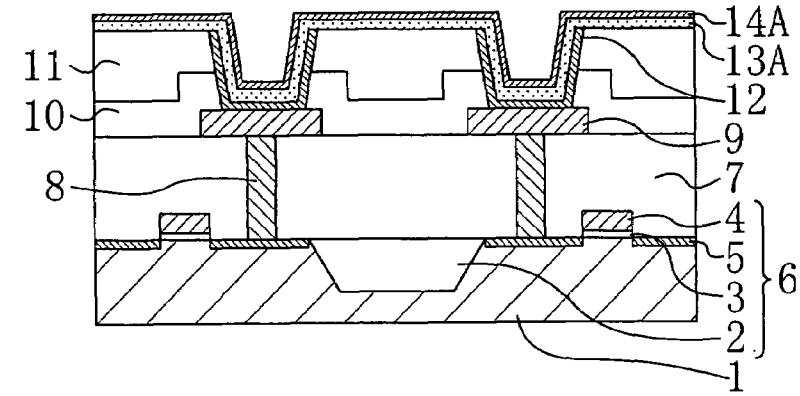

Next, referring to FIG. 3D, a capacitative insulation film formation film 13A is formed by sputtering or MOCVD on the whole surface of the plasma CVD oxide film 11 and each bottom electrode 12 which has a concave cross section. The capacitative insulation film formation film 13A is formed of, for example, ferroelectric material and has a film thickness of 40 nm to 100 nm. As a material for the capacitative insulation film formation film 13A, a ferroelectric material such as BST, PZT, or SBT is used. Subsequently, a top electrode formation film 14A having a film thickness of 20 nm to 40 nm is formed on the capacitative insulation film formation film 13A by sputtering, CVD, or MOCVD under the same formation condition as, for example, the bottom electrode formation film 12A.

Figure 4A:
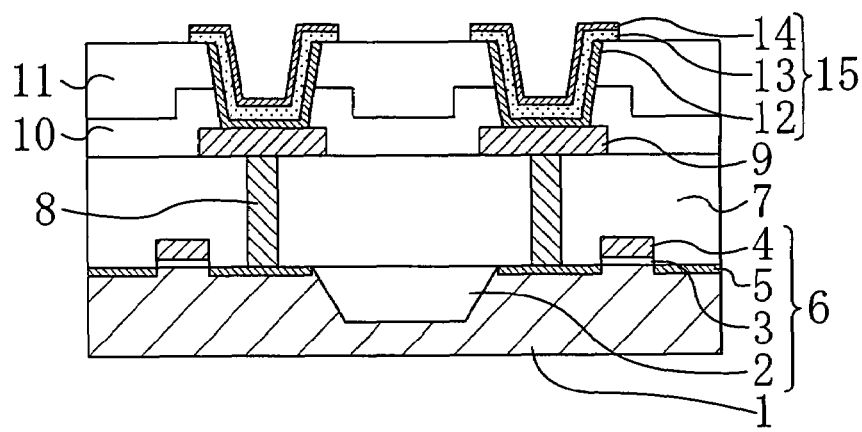
FIGS. 4A through 4C are cross sections with which a manufacturing method of the dielectric memory according to Embodiment 1 is described.

Next, referring to FIG. 4A, the capacitative insulation film formation film 13A and the top electrode formation film 14A is patterned by lithography and dry etching methods to form a capacitative insulation film 13 and a top electrode 14 provided on the capacitative insulation film 13. The capacitative insulation film 13 covers the bottom electrode 12 and has a concavity due to the opening 22. In these steps, the capacitor 15 is formed which has a concave cross section and includes the bottom electrode 12, the capacitative insulation film 13, and the top electrode 14.

Figure 4B:
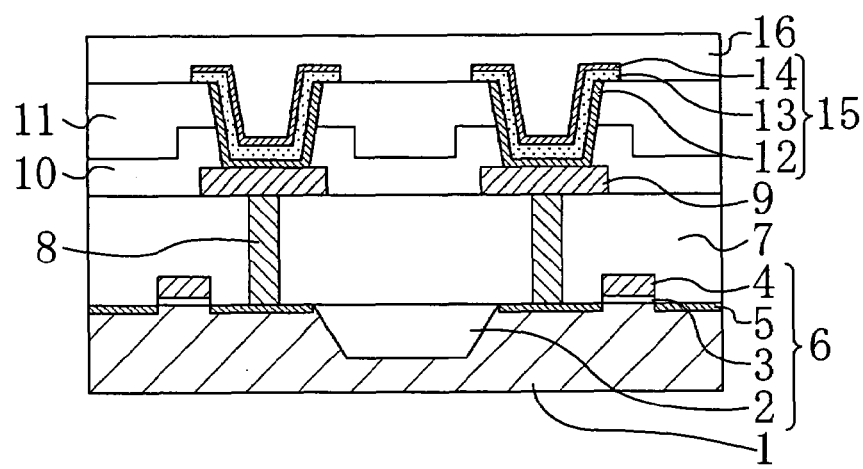

Next, referring to FIG. 4B, a second ozone TEOS film 16 is formed on the plasma CVD oxide film 11 to cover the capacitor 15 by CVD. Then, the second ozone TEOS film 16 is planarized by CMP. It is preferable that the planarized second ozone TEOS film 16 on the plasma CVD oxide film 11 has a film thickness of 50 nm to 600 nm, and it is more preferable the film thickness is 300 nm to 600 nm. The second ozone TEOS film having a film thickness of 50 nm or more can prevent the deformation of the top electrode in a thermal anneal performed later.

Figure 4C:
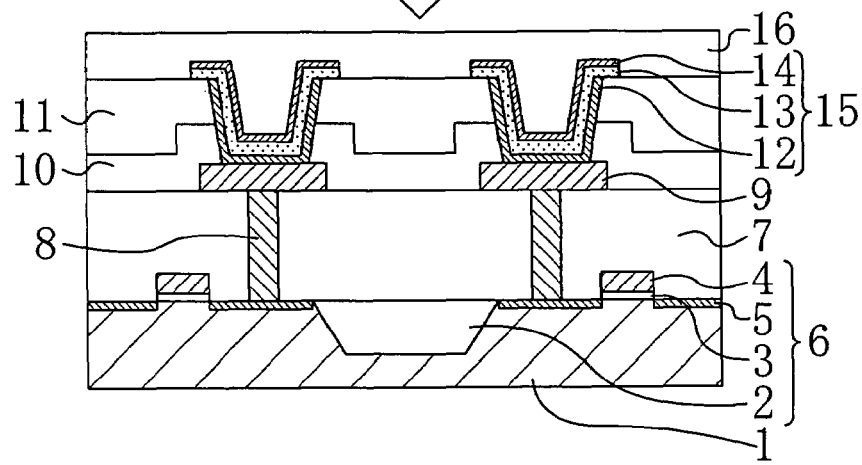

Next, referring to FIG. 4C, a thermal anneal is performed in an oxygen atmosphere at a high temperature in order to crystallize the ferroelectric material forming the capacitative insulation film 13 and to improve film quality of the capacitative insulation film 13. Note that, the thermal anneal may be an annealing process in an oven or may be Rapid Thermal Anneal (RTA). A heating temperature is preferably 700° C. to 800° C.

It is preferable that the thermal anneal is performed after the second ozone TEOS film 16 is formed on the capacitor 15. A thermal anneal performed on the exposed top electrode 14 without the second ozone TEOS film 16 may cause deformation, hillock, or abrasion of the top electrode 14. The dielectric memory of Embodiment 1 is manufactured in the steps mentioned above.

The oxygen diffusion prevention layer is reduced or deteriorated when hydrogen produced in growing the plasma CVD oxide film reaches the oxygen diffusion prevention layer. However, as explained above, according to the manufacturing method of Embodiment 1, after the ozone TEOS film is formed on the oxygen diffusion prevention layer, the plasma CVD oxide film is formed. Therefore, it is possible to suppress the reduction or deterioration of the oxygen diffusion prevention layer. Moreover, the plasma CVD oxide film is provided between the first ozone TEOS film and the second ozone TEOS film. Therefore, it is possible to prevent the occurrences of crack in a thick ozone TEOS film, which was a problem in a vertical capacitor. Consequently, the method of Embodiment 1 enables a dielectric constant memory having high reliability to be manufactured with a good yield.

Explanations have been given with reference to an example of the dielectric memory in which a capacitor 15 is connected to the impurity diffusion layer 5 of the transistor 6. However, a structure of the interlayer insulation film of Embodiment 1 is applicable to a dielectric memory having a structure in which the bottom electrode 12 of the capacitor 15 is connected to a gate electrode of the transistor 6 on condition that the oxygen diffusion prevention layer is formed on the contact plug 8.

Embodiment 2

Embodiment 2 of the present invention will be described below with reference to the drawings. Note that, descriptions corresponding to Embodiment 1 are omitted.

As described above, as the oxygen diffusion prevention layer, a multilayer film formed of a metal nitride film and a single elementary film of a noble metal is used. That is, the oxygen diffusion prevention layer includes the single elementary film of a noble metal which is not reduced by hydrogen. Therefore, a plasma CVD oxide film which produces hydrogen can be directly formed on the oxygen diffusion prevention layer. Specifically, barrier function of oxygen diffusion prevention layer against oxygen is not decreased. Moreover, cracks in a thick ozone TEOS film can be eliminated because the ozone TEOS film is not used. Therefore, it is possible to suppress oxidation of a contact plug and improve reliability of the dielectric memory more than Embodiment 1.

A manufacturing method of a second dielectric memory device structured as mentioned above will be explained with reference to the drawings.

FIGS. 7A through 7F, FIGS. 8A through 8D, and FIGS. 9A through 9C are cross sections with which a manufacturing method of a dielectric memory of Embodiment 2 of the present invention will be described. Note that, steps illustrated with FIGS. 7A through 7D correspond to the steps illustrated with FIGS. 2A through 2D and the descriptions thereof are omitted.

Figure 7A:
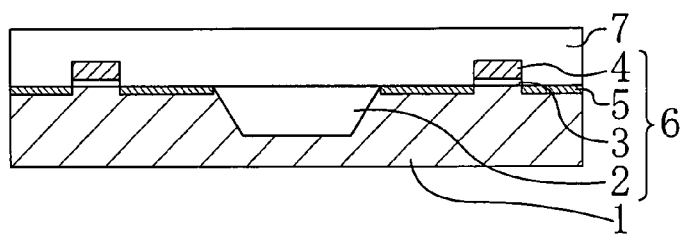
FIGS. 7A through 7F are cross sections with which a manufacturing method of the dielectric memory according to Embodiment 2 is described.
Figure 7B:
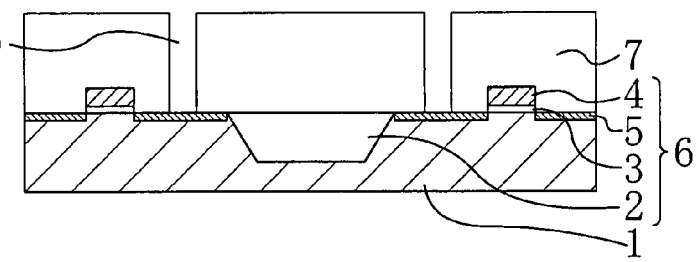
Figure 7C:
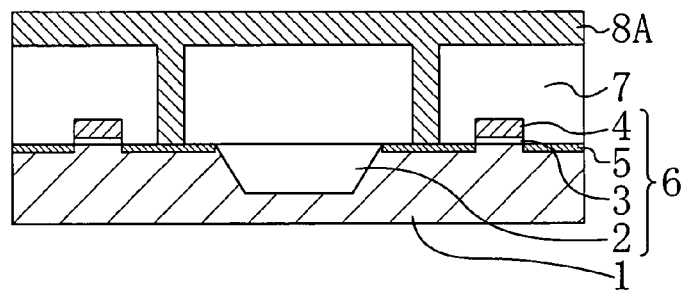
Figure 7D:
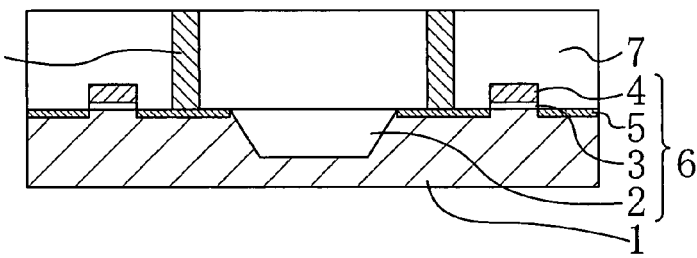
Figure 7E:
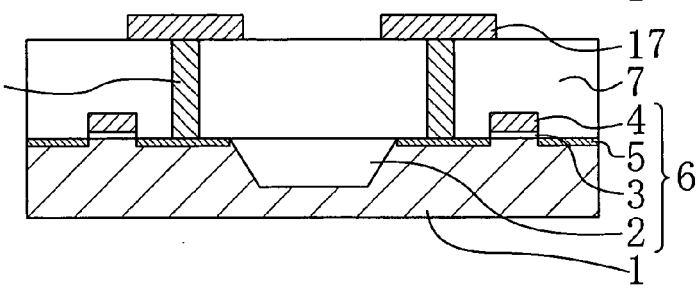

Next, referring to FIG. 7E, an oxygen diffusion prevention layer formation film is formed on the whole surface of the first interlayer insulation film 7 by, for example, sputtering, CVD, or Metal Organic Chemical Vapor Deposition (MOCVD). The oxygen diffusion prevention layer formation film has a film thickness of 50 nm to 300 nm and prevents the oxidation of the contact plugs 8. As the oxygen diffusion prevention layer formation film, a multilayer film is used which is formed by a film formed of a metal nitride, such as titanium nitride, titanium aluminum nitride, or titanium aluminum oxynitride and a single elementary film formed of a noble metal, such as platinum, iridium or ruthenium. Next, the oxygen diffusion prevention layer formation film is patterned by lithography and dry etching methods to form oxygen diffusion prevention layers 17. Each oxygen diffusion prevention layer 17 covers each contact plug 8 and around the contact plug 8. Note that, removing the contact plug formation film 8A from the first interlayer insulation film 7 may form a concavity (recess) on the top end surface of each contact plug 8, and each oxygen diffusion prevention layer 17 may be provided in this concavity. Such structure is not shown.

Figure 7F:
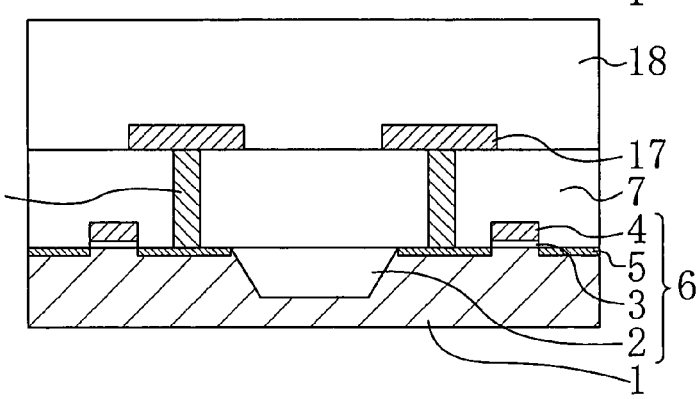
Figure 8A:
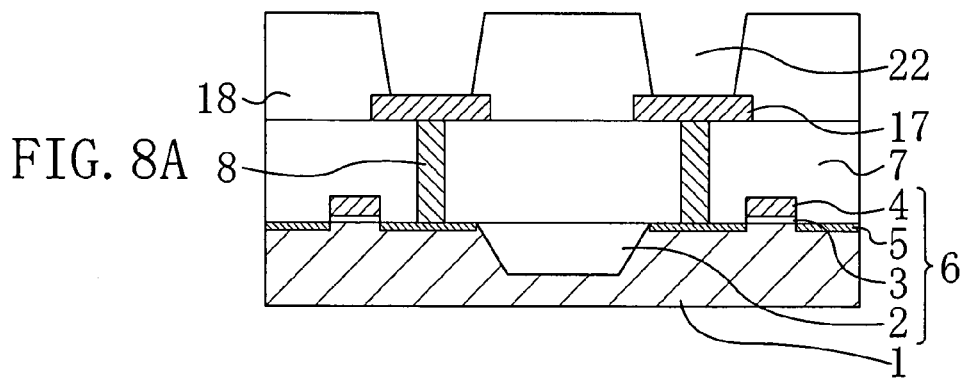
FIGS. 8A through 8D are cross sections with which a manufacturing method of the dielectric memory according to Embodiment 2 is described.
Figure 8B:
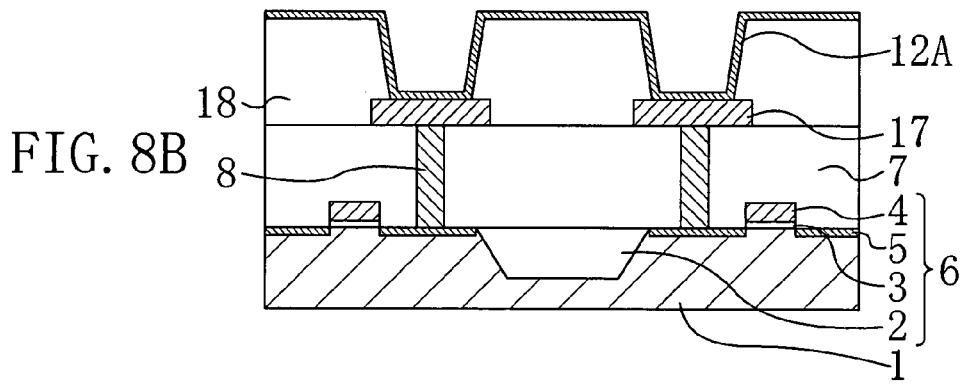
Figure 8C:
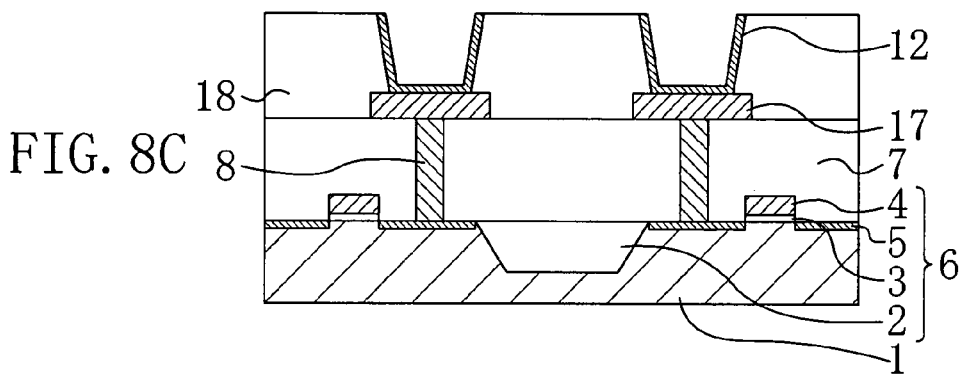
Figure 8D:
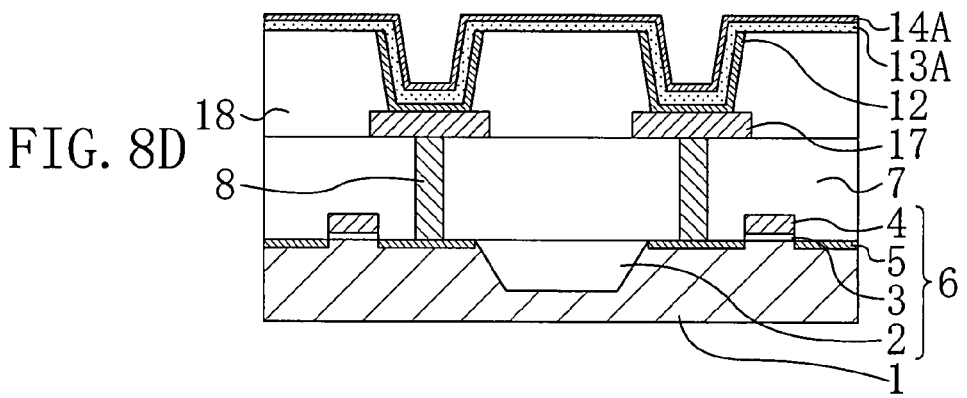
Figure 10:
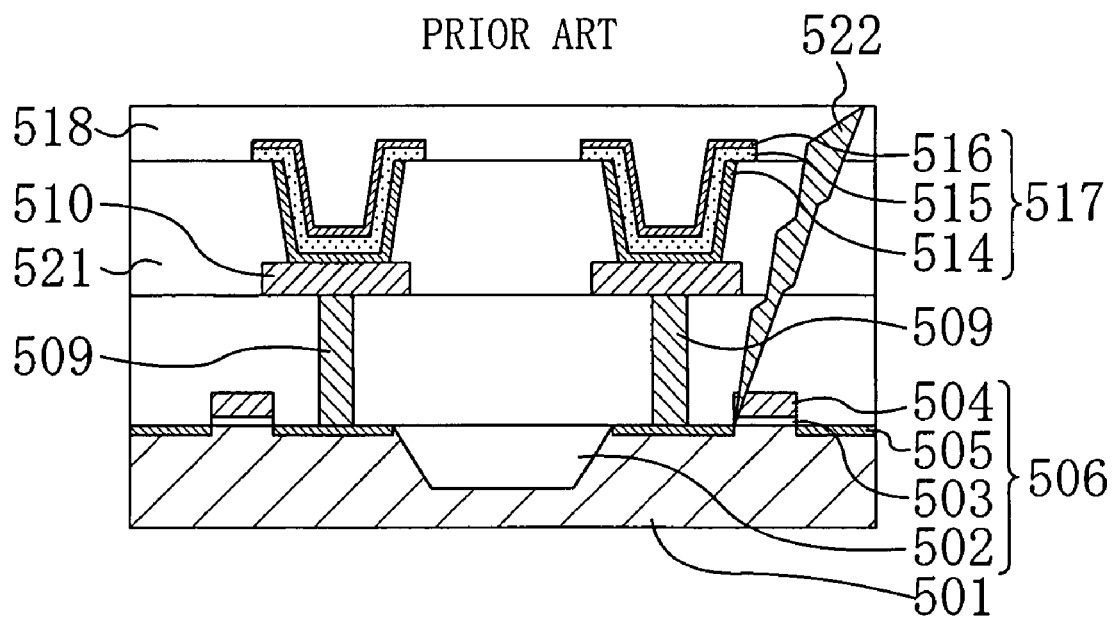
FIG. 10 is a cross section illustrating a conventional dielectric memory having a vertically stacked capacitor.

Next, referring to FIG. 7F, a second interlayer insulation film 18 which is a plasma CVD oxide film is formed on the first interlayer insulation film 7 to cover the oxygen diffusion prevention layers 17, the second interlayer insulation film 18 having a film thickness of about 50 nm to about 1500 nm. Then, the second interlayer insulation film 18 is planarized by CMP. In this case, the film thickness of he second interlayer insulation film 18 is a parameter which determines the capacitance value of a capacitor 15. In this case, it is preferable that the second interlayer insulation film has a film thickness of about 600 nm to 1200 nm.

Note that, subsequent manufacturing steps of FIGS. 8 and 9 correspond to the 10 manufacturing steps of Embodiment 1 illustrated with FIGS. 3A through 3D and FIGS. 4A through 4C and will not explained again.

According to the manufacturing method of Embodiment 2, it is possible to manufacture a dielectric memory having high reliability with less steps than Embodiment 1.

The dielectric memory and manufacturing method thereof according to the above-mentioned present invention are applicable a vertically stacked capacitor having an oxygen diffusion prevention layer to prevent deterioration of the oxygen diffusion prevention layer and dielectric film and cracking in the interlayer films.

What is claimed is:

1. A dielectric memory comprising:
   an interlayer insulation film on a semiconductor substrate;
   a contact plug in the interlayer insulation film;
   an oxygen diffusion prevention layer on an upper surface of the contact plug;
   a first ozone TEOS film on the interlayer insulation film, the first ozone TEOS film covering the oxygen diffusion prevention layer;
   a plasma CVD oxide film on the first ozone TEOS film;
   a capacitor formed in an opening which penetrates through the first ozone TEOS film and the plasma CVD oxide film and reaches an upper surface of the oxygen diffusion prevention layer, the capacitor including a bottom electrode, a dielectric film, and a top electrode; and
   an insulation film on the plasma CVD oxide film, the insulation film covering the capacitor.

2. A dielectric memory of claim 1, wherein the insulation film is a second ozone TEOS film.

3. A dielectric memory of claim 2, wherein each of the first ozone TEOS film and the second ozone TEOS film have a film thickness of 50 nm to 600 nm.

4. A dielectric memory of claim 1, wherein the oxygen diffusion prevention layer contains a noble metal oxide.

5. A manufacturing method of a dielectric memory comprising the steps of:
   forming an interlayer insulation film on a substrate;
   forming a contact plug in the interlayer insulation film to contact the substrate;
   forming an oxygen diffusion prevention layer on the interlayer insulation film to contact the contact plug;
   forming a first insulation film on the oxygen diffusion prevention layer such that hydrogen is not produced in a formation process;
   forming a plasma CVD oxide film on the first insulation film;
   forming an opening to penetrate through the first insulation film and The plasma CVD oxide film and to reach an upper surface of the oxygen diffusion prevention layer;
   forming a capacitor including a bottom electrode, a dielectric film, and a top electrode along the opening; and
   forming a second insulation film on the plasma CVD oxide film such that hydrogen is not produced in a formation process to cover the capacitor.

6. A manufacturing method of claim 5, wherein the first insulation film is an ozone TEOS film.

7. A manufacturing method of claim 6, wherein the first insulation film has a film thickness of 50 nm to 600 nm.

8. A manufacturing method of claim 5, wherein the second insulation film is an ozone TEOS film.

9. A manufacturing method of claim 8, wherein the second insulation film has a film thickness of 50 nm to 600 nm.

10. A manufacturing method of claim 5, wherein the oxygen diffusion prevention layer contains a noble metal oxide.

* * * * *